United States Patent
Caprara

(10) Patent No.: US 7,991,026 B2
(45) Date of Patent: Aug. 2, 2011

(54) INTRACAVITY FREQUENCY-CONVERTED OPTICALLY-PUMPED SEMICONDUCTOR LASER WITH RED-LIGHT OUTPUT

(75) Inventor: Andrea Caprara, Palo Alto, CA (US)

(73) Assignee: Coherent, Inc., Santa Clara, CA (US)

( * ) Notice: Subject to any disclaimer, the term of this patent is extended or adjusted under 35 U.S.C. 154(b) by 243 days.

(21) Appl. No.: 12/488,152

(22) Filed: Jun. 19, 2009

(65) Prior Publication Data
US 2010/0322270 A1 Dec. 23, 2010

(51) Int. Cl.
*H01S 3/10* (2006.01)
(52) U.S. Cl. .............. 372/22; 372/21; 372/100; 372/98; 372/75; 372/43.01
(58) Field of Classification Search .............. 372/22, 372/21, 100, 98, 75, 43.01
See application file for complete search history.

(56) References Cited

U.S. PATENT DOCUMENTS

| | | | |
|---|---|---|---|
| 5,991,318 A | 11/1999 | Caprara et al. | |
| 6,097,742 A | 8/2000 | Caprara et al. | |
| 6,108,356 A * | 8/2000 | Yin | 372/22 |
| 6,233,089 B1 | 5/2001 | Nebel | |
| 6,304,237 B1 | 10/2001 | Karakawa | |
| 6,480,325 B1 | 11/2002 | Batchko et al. | |
| 6,483,556 B1 * | 11/2002 | Karakawa et al. | 348/750 |
| 7,016,103 B2 | 3/2006 | Paschotta et al. | |
| 7,079,557 B1 | 7/2006 | Yin et al. | |
| 7,447,245 B2 | 11/2008 | Caprara et al. | |
| 2005/0163187 A1 * | 7/2005 | Spinelli et al. | 372/94 |

OTHER PUBLICATIONS

D.J.M. Stothard et al., "Stable, continuous-wave, intracavity, optical parametric oscillator pumped by a semiconductor disk laser (VECSEL)," *Optics Express*, vol. 17, No. 13, Jun. 22, 2009, pp. 10648-10658.

International Search Report and Written Opinion received for PCT Patent Application No. PCT/US2010/038770, mailed on Sep. 13, 2010, 18 pages.

* cited by examiner

*Primary Examiner* — Kinam Park
(74) *Attorney, Agent, or Firm* — Morrison & Foerster LLP

(57) ABSTRACT

In a branched resonator OPS-laser arrangement, a combination of intra-cavity optical parametric generation and intra-cavity sum-frequency mixing provides output radiation in a range between about 550 nanometers about 700 nanometers from an OPS fundamental wavelength in a range between about 900 nm and about 1100 nm.

20 Claims, 2 Drawing Sheets

INTRACAVITY FREQUENCY-CONVERTED OPTICALLY-PUMPED SEMICONDUCTOR LASER WITH RED-LIGHT OUTPUT

TECHNICAL FIELD OF THE INVENTION

The present invention relates in general to optically-pumped external-cavity surface-emitting semiconductor lasers (OPS-Lasers). The invention relates in particular to intra-cavity frequency conversion in such lasers.

DISCUSSION OF BACKGROUND ART

An OPS-laser is increasingly being recognized as being a laser device that can provide a beam of continuous wave (CW) laser radiation of high brightness and high quality. In theory at least, there are semiconductor alloy material groups that can used for such lasers that will provide laser radiation at any wavelength. In practice, only wavelengths in certain ranges can be generated with high power and reasonable efficiency. This can be due, inter alia, to lack of adequate conversion efficiency in a particular semiconductor alloy compositions, instability of an alloy, or lack of an adequate pump-light source. By way of example blue-green and green wavelengths can in theory be generated in lasers made from II-VI semiconductor alloys. These must be pumped, however, by blue diode-lasers which at present have limited power output and efficiency. In practice, blue and blue-green wavelengths can be more efficiently and reliably generated by intra-cavity second-harmonic conversion (frequency-doubling) of the fundamental radiation of OPS-lasers made from III-V semiconductor alloys such as indium gallium arsenide phosphide (InGaAsP) which have relatively high conversion efficiency and can be pumped with radiation from III-V diode-lasers which also have high conversion efficiency.

There are laser applications that require several Watts (W) of high quality beam power in the orange and red regions of the visible spectrum. Red laser light having a wavelength of about 630 nanometers (nm) is useful in laser display applications. Orange and yellow laser light having a wavelength between about 570 nm and 590 nm is useful in certain laser skin-treatments. In an OPS-laser system, none of these wavelengths can be efficiently generated with adequate power and efficiency as a fundamental wavelength beam, or by harmonic-conversion of a fundamental wavelength beam having a wavelength two or more times longer than the red, orange, or yellow wavelength.

SUMMARY OF THE INVENTION

In one aspect of the present invention, a method of generating radiation having a wavelength between about 550 nm and 700 nm comprises generating laser radiation having a fundamental wavelength. The fundamental wavelength radiation is circulated through a first optically nonlinear crystal arranged to divide a portion of the circulating fundamental wavelength radiation into signal wavelength and idler wavelength radiation portions, the signal wavelength being longer than the fundamental wavelength and shorter than the idler wavelength. The signal wavelength radiation and a remaining portion of the fundamental wavelength radiation are circulated through a second optically nonlinear crystal arranged to generate output radiation by sum-frequency mixing the fundamental wavelength and signal wavelength radiations. The fundamental wavelength is selected such that the output radiation has a wavelength between about 550 nm and 700 nm.

In another aspect of the present invention optical apparatus includes first and second resonators having first and second portions, with the first resonator portions being coaxial and the second portions separate. An OPS-structure is located in the second portion of the first resonator. An arrangement is provided for delivering optical pump radiation to the OPS-structure such that laser radiation having a fundamental wavelength circulates in the first resonator. A first optically nonlinear crystal is located in the coaxial first portions of the first and second resonators and arranged for optical parametric division of a portion of the fundamental wavelength radiation into signal radiation and idler radiation portions. The signal radiation portion has a wavelength greater than the wavelength of the fundamental radiation and less than the wavelength of the idler radiation portion. An optical arrangement is provided for directing the signal radiation into the second portion of the second resonator such that signal radiation circulates in the second resonator. A second optically nonlinear crystal is located in the coaxial first portions of the first and second resonators and arranged for sum-frequency mixing circulating fundamental wavelength radiation and signal wavelength radiation to provide sum-frequency radiation. The fundamental wavelength of the OPS-laser radiation is selected such that the sum-frequency radiation has a wavelength between about 550 nanometers and about 700 nanometers.

The first nonlinear crystal provides, through a nonlinear parametric process, amplification for the signal wavelength such that the signal wavelength radiation circulates with high intensity in the second resonator, which combined with a high circulating fundamental radiation intensity allows resonant sum-frequency mixing to generate watt-level sum frequency output. In one arrangement wherein 628 nm-wavelength, sum-frequency radiation is generated from 1064 nm-wavelength OPS-laser radiation, it is estimated that about 5 Watts of sum-frequency radiation can be generated from 50 Watts of pump power delivered to the OPS-structure.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
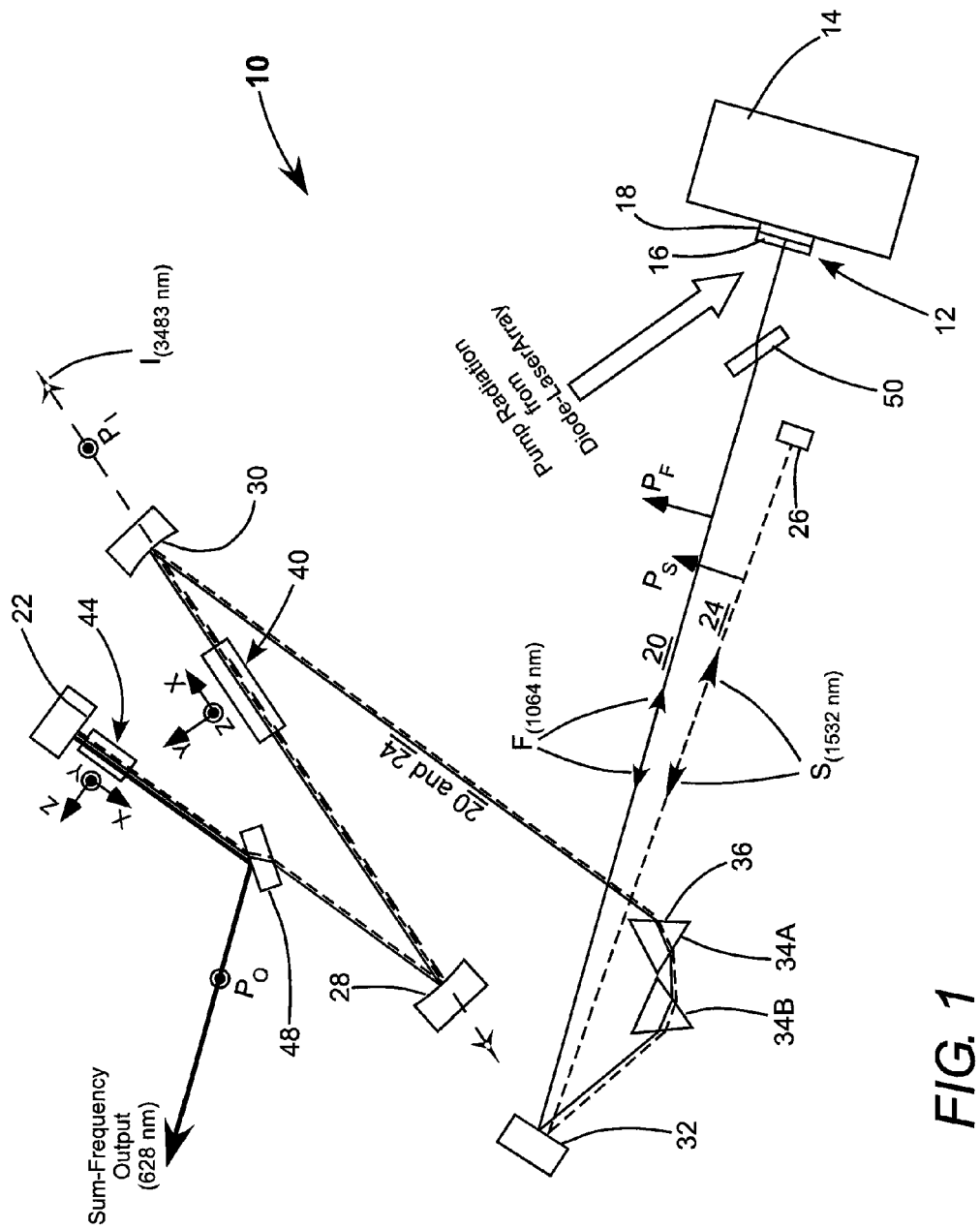
FIG. 1 schematically illustrates a preferred embodiment of laser apparatus in accordance with the present invention wherein a portion of fundamental radiation generated on an OPS-laser resonator is converted by optical parametric division to signal and idler radiation in a first optically nonlinear crystal and a residual portion of the fundamental radiation is sum-frequency mixed with signal radiation in a second optically nonlinear crystal to provide output radiation.

Referring now to the drawings, wherein like components are designated by like reference numerals, FIG. 1 schematically illustrates a preferred embodiment 10 of an intra-cavity frequency-converted OPS-laser in accordance with the present invention. Laser 10 includes an OPS-structure (OPS-Chip) 12 mounted on a heat sink 14. OPS-chip 12 includes an epitaxially-grown multilayer semiconductor gain-structure 16 surmounting a mirror-structure 18. Semiconductor gain-structure 16 is a III-V semiconductor structure having active or quantum well layers separated by spacer layers, with the active layers formulated to provide peak gain at a wavelength between about 950 nm and 1100 nm, i.e., a near infrared (NIR) wavelength. For purposes of this description it is assumed that the peak-gain of gain-structure 16 is selected to be 1064 nm. Methods of fabricating OPS-chips are well known in the art to which the present invention pertains and a description thereof is not necessary for understanding principles of the present invention. Accordingly, no such description is provided herein. A detailed description of fabricating OPS-chips, particularly III-V NIR chips, is provided in U.S. Pat. No. 6,097,742, assigned to the assignee of the present invention and the complete disclosure of which is hereby incorporated by reference.

An OPS-laser resonator 20 is formed between a plane mirror 22 and mirror-structure 18 of the OPS-chip 12. A passive resonator 24 is formed between mirror 22 and a plane mirror 26. Each resonator is folded by a concave mirror 28, a concave mirror 30, prisms 34A and 34B, and a plane mirror 32.

Pump radiation from a diode-laser array is directed onto gain-structure 16 of OPS-chip 12 causing fundamental radiation F to circulate in resonator 20. Radiation F is assumed in this example to have a wavelength of 1064 nm as noted above. The path of fundamental (radiation) is designated in FIG. 1 by a fine solid line. Those skilled in the art will recognize without further detailed description or illustration that the pump radiation may be delivered via a fiber or a fiber bundle, or project by suitable optics directly from a diode-laser or array thereof onto the gain-structure.

Located at a beam-waist location of the circulating fundamental radiation between concave mirrors 28 and 30 is an optically nonlinear crystal 40 and arranged for type-III optical parametric conversion (frequency division) of a portion of the fundamental radiation into a signal portion S and an idler portion I. The principal axes X, Y, and Z of crystal 40 are indicated. The portion converted depends, inter alia, on the fundamental radiation intensity within the crystal and the material of the crystal.

In this example it is assumed that crystal 40 is a crystal of potassium titanyl arsenate (KTA), and the signal and idler portions have wavelengths of about 1532 nm and about 3483 nm, respectively. The path of the signal radiation is designated in FIG. 1 by a short-dashed line, and the path of the idler radiation is designated by a long-dashed line. Another possible optically nonlinear crystal for providing the optical parametric division is rubidium titanyl arsenate (RTA).

The fundamental, signal, and idler radiations are all plane-polarized. The polarization-orientation of the fundamental and signal radiations are the same, here, in the plane of FIG. 1 as indicated by arrows $P_F$ and $P_S$. The polarization orientation of the fundamental radiation is selected by a birefringent filter (BRF) 50, which also selects the fundamental wavelength from the gain-bandwidth of gain-structure 16. The polarization-orientation of the idler radiation is perpendicular to the orientation of the fundamental radiations (perpendicular to the plane of the drawing) as indicated by arrowhead $P_I$.

Mirrors 22, 28, 30, and 32 are each highly reflective for the fundamental and signal wavelengths. Mirrors 28 and 30 are highly transparent at the idler wavelength, mirror 26 is maximally reflective at the signal wavelength, and, of course, mirror structure 18 of OPS chip 12 is highly reflective at the fundamental wavelength. Prisms 34A and 34B are preferably isosceles Brewster prisms preferably of lithium triborate (LBO) and width an apex angle of 63.8°. Signal radiation S circulates in resonator 24 with essentially no signal radiation being allowed to escape from the resonator. Idler radiation is discarded from the resonator by transmission through mirrors 28 and 30. Resonators 20 and 24 are collinear (coaxial) between mirror 22 and face 36 of prism 34A. The different fundamental and signal wavelengths result in prisms 34A and 34B causing angular separation of the fundamental and signal radiations and accordingly branching of the axes of resonators 20 and 24.

It should be noted here that dichroic-mirror (filter) separation or branching of the resonator paths is possible, in theory at least, in the inventive apparatus. However, as the fundamental and signal radiations have the same polarization orientation, normal manufacturing tolerances on commercial dichroic filters could result in significant loss in the one of the resonators that was transmitted through the dichroic mirror. Incidence of the fundamental and signal radiations on the prism faces at or near the Brewster angle for the prism material provides that near lossless branching of the resonators is possible.

It is estimated that for a pump power of about 50 W delivered to gain-structure 16 of OPS chip about 600 W of fundamental radiation and about 250 W of signal radiation would circulate together in the coaxial portion of resonators 20 and 24. There is a beam-waist location for both the fundamental and signal radiations adjacent mirror 22. Located at this beam-waist location is an optically nonlinear crystal 44, preferably of LBO with principle axes indicated, arranged for type-1, non-critical, sum-frequency mixing of the signal and fundamental wavelengths to generate sum-frequency radiation plane-polarized in an orientation perpendicular to that of the fundamental and signal radiations as indicated by arrowhead $P_O$. The sum-frequency radiation is designated in FIG. 1 by a bold solid line, and has a (red) wavelength of about 628 nm for the exemplified wavelengths of fundamental and signal radiations. For a 3 mm long LBO crystal the total interaction length is 6 millimeters (mm), since the signal and fundamental radiation transverse in both a forward and backward direction. For a fundamental beam radius of 50 microns in the crystal, and a signal beam radius of 60 microns, it is estimated that about 5 Watts of sum frequency radiation at 628 nm is generated.

The sum-frequency radiation is directed out of the coaxial portion of resonators 20 and 24 by a polarization-sensitive dichroic beamsplitter 48. The beamsplitter is arranged such that fundamental and signal radiations are incident thereon at or near the Brewster angle and P-polarized with respect to the beamsplitter. This minimizes losses in resonators 20 and 24. The sum-frequency radiation is S-polarized with respect to beamsplitter 48 and is reflected out of the resonators as output radiation.

It is particularly important that the phase-matching bandwidth for the sum-frequency generation process in optically nonlinear crystal 44 is substantially greater than the phase-matching bandwidth for the parametric frequency division process in optically nonlinear crystal 40. If such a condition is not fulfilled, the signal resonator (resonator 24) will oscillate at a frequency outside the sum-frequency process bandwidth but still within the parametric generation bandwidth, since by doing so it will not generate any red (sum-frequency) radiation and minimize losses.

For this and other reasons, LBO is a particularly preferred material for crystal 44 as it has a very large bandwidth for the sum-frequency generation process. By way of example if the fundamental radiation has a wavelength of 1064 nm, the signal radiation wavelength can be varied by more than ±50 nm around the nominal value of 1543 nm without a noticeable decrease in the efficiency of the sum-frequency generation process. In contrast, the bandwidth of the parametric generation process for a 6 mm-long KTA crystal falls to one-half of its peak value as the signal wavelength varies by only ±0.5 nm. In addition LBO provides for non-critical phase-matching near room temperature for generation of all of the yellow to red wavelengths of interest from about 550 nm to about 700 nm. In particular the temperature for sum-frequency generation of 628 nm output radiation with a signal wavelength of 1064 nm is estimated to be about 15.6 Celsius, and the temperature for sum-frequency generation of 575 nm output radiation with a signal wavelength of 980 nm is estimated to be about 50.7 Celsius. Preferably, crystal 44 is mounted on a thermoelectric cooling TEC device, or the like, to maintain the temperature of the crystal at a desired level.

Figure 2:
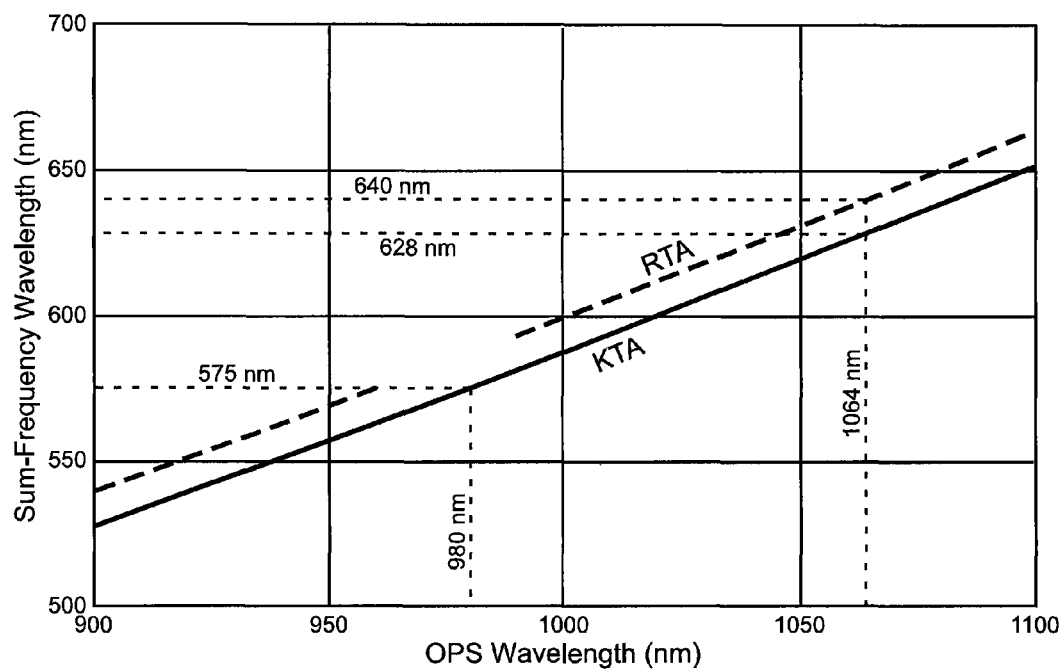
FIG. 2 is a graph schematically illustrating the output radiation wavelength as a function of the fundamental radiation wavelength for second optically nonlinear crystals of RTA and KTA.

FIG. 2 is a graph schematically illustrating the sum-frequency output as a function of the OPS-laser fundamental wavelength for an optically nonlinear crystal 40 of KTA (solid curve) and RTA (dashed curves). An OPS-laser wavelength of about 1064 nm provides about 628 nm output using a KTA crystal as crystal 40, and about 640 nm output using an RTA crystal as crystal 40. An OPS-laser wavelength of about 980 nm provides about 575 nm output using a KTA crystal as crystal 40. The wavelengths 980 nm and 1064 nm are readily available in OPS chips as they are preferred wavelengths for fiber-laser pumping as fundamental wavelengths, and for intra-cavity frequency-doubling to provide green and blue-green wavelengths. Note that while FIG. 2 indicates that the arrangement of FIG. 1 can be used to provide green wavelengths, such green wavelengths are more efficiently provided by frequency-doubling as noted above.

In conclusion, the present invention relies on a combination of resonant intra-cavity parametric generation in a first optically nonlinear crystal and resonant sum-frequency mixing in a second optically non linear crystal, in a branched resonator, to provide sum-frequency output at yellow to red wavelengths. An OPS-structure provides fundamental radiation for the parametric generation and sum-frequency mixing processes. The first optically nonlinear crystal provides, through the nonlinear parametric process, amplification for signal wavelength radiation such that the signal wavelength radiation circulates with high intensity, which combined with a high circulating fundamental radiation intensity allows resonant sum-frequency mixing to generate multi Watt level, CW, sum-frequency output. In one arrangement wherein 628 nm-wavelength sum-frequency radiation is generated from 1064 nm-wavelength OPS-laser radiation, it is estimated that about 5 Watts of sum-frequency radiation can be generated from 50 Watts of pump power delivered to the OPS-structure.

Those skilled in the art will recognize that while the present invention is described above with reference to generating CW radiation, this CW radiation could be modulated, for example by modulating the pump radiation delivered to the OPS chip. Those skilled in the art may also devise other resonator arrangements for carrying out the combination of intra-cavity parametric generation and sum-frequency mixing without departing from the spirit and scope of the present invention.

It is emphasized, here, however, that while 1064 nm radiation can be generated by diode-pumping a solid state-gain medium such as neodymium-doped YAG (Nd:YAG) or neodymium doped yttrium vanadate (Nd:YVO$_4$) such solid-state gain-media are unsuitable for providing fundamental radiation in a resonator of the inventive laser. This is because such solid-state gain media have relatively long excited-state lifetimes which, in combination with the presence of two optically non-linear crystals in the resonator, would allow spurious, short-lived relaxation oscillations in the resonator, which in turn would lead to unacceptable noise and instability in the sum-frequency output.

In summary, the present invention is described above with reference to a preferred embodiment. The invention is not limited, however, to the embodiment described and depicted. Rather the invention is limited only by the claims appended hereto.

What is claimed is:

1. Optical apparatus comprising:
   first and second resonators having first and second portions with the first resonator portions being coaxial and the second portions separate;
   an OPS-structure located in the second portion of the first resonator;
   an arrangement for delivering optical pump radiation to the OPS-structure such that laser radiation having a fundamental wavelength circulates in the first resonator;
   a first optically nonlinear crystal located in the coaxial first portions of the first and second resonators and arranged for optical parametric division of a portion of the fundamental wavelength radiation into signal radiation and idler radiation portions, the signal radiation portion having a wavelength greater than the wavelength of the fundamental radiation and less than the wavelength of the idler radiation portion;
   an optical arrangement for directing the signal radiation into the second portion of the second resonator such that signal radiation circulates in the second resonator;
   a second optically nonlinear crystal located in the coaxial first portions of the first and second resonators and arranged for sum-frequency mixing circulating fundamental wavelength radiation and signal wavelength radiation to provide sum-frequency radiation; and
   wherein the fundamental wavelength of the OPS-laser radiation is selected such that the sum-frequency radiation has a wavelength between about 550 nanometers and 700 nanometers.

2. The apparatus of claim 1, wherein the fundamental wavelength radiation has a wavelength between about 900 nanometers and about 1100 nanometers.

3. The apparatus of claim 1, wherein the second optically nonlinear crystal is a crystal of lithium triborate (LBO).

4. The apparatus of claim 1, wherein the first optically nonlinear crystal is a crystal of potassium titanyl arsenate (KTA).

5. The apparatus of claim 4, wherein the sum-frequency radiation has a wavelength of about 628 nanometers and the fundamental wavelength radiation has a wavelength of about 1064 nanometers.

6. The apparatus of claim 4, wherein the sum-frequency radiation has a wavelength of about 575 nanometers and the fundamental wavelength radiation has a wavelength of about 980 nanometers.

7. The apparatus of claim 5, wherein the first optically nonlinear crystal is a crystal of rubidium titanyl arsenate (RTA).

8. The apparatus of claim 1, wherein the first optically nonlinear crystal has a first bandwidth for the parametric division and the second optically nonlinear crystal has a second bandwidth for the sum-frequency mixing and wherein the second bandwidth is greater than the first bandwidth.

9. The apparatus of claim 1, wherein the optical arrangement for directing the signal radiation into the second portion of the second resonator is a pair of isoceles Brewster prisms.

10. The apparatus of claim 9, wherein the prisms are LBO prisms having an apex angle of about 63.8 degrees.

11. Optical apparatus comprising:
first and second resonators having first and second portions with the first resonator portions being coaxial and the second portions separate;
an OPS-structure located in the second portion of the first resonator;
an arrangement for delivering optical pump radiation to the OPS-structure such that laser radiation having a fundamental wavelength circulates in the first resonator;
a first optically nonlinear crystal located in the coaxial first portions of the first and second resonators and arranged for optical parametric division of a portion of the fundamental wavelength radiation into signal radiation and idler radiation portions, the signal radiation portion having a wavelength greater than the wavelength of the fundamental radiation and less than the wavelength of the idler radiation portion, the first optically nonlinear crystal having a first bandwidth for the parametric division process;
an optical arrangement for directing the signal radiation into the second portion of the second resonator such that signal radiation circulates in the second resonator;
a second optically nonlinear crystal located in the coaxial first portions of the first and second resonators and arranged for sum-frequency mixing circulating fundamental wavelength radiation and signal wavelength radiation to provide sum-frequency radiation, the second optically nonlinear crystal having a second bandwidth for the sum-frequency mixing process the second bandwidth being greater than the first bandwidth; and
wherein the fundamental wavelength of the OPS-laser radiation is selected such that the sum-frequency radiation has a wavelength between about 550 nanometers and 700 nanometers.

12. The apparatus of claim 11, wherein the fundamental wavelength radiation has a wavelength between about 900 nanometers and about 1100 nanometers.

13. The apparatus of claim 11, wherein the second optically nonlinear crystal is a crystal of lithium triborate (LBO) and the first optically nonlinear crystal is a crystal of potassium titanyl arsenate (KTA).

14. The apparatus of claim 13, wherein the sum-frequency radiation has a wavelength of about 628 nanometers and the fundamental wavelength radiation has a wavelength of about 1064 nanometers.

15. The apparatus of claim 13, wherein the sum-frequency radiation has a wavelength of about 575 nanometers and the fundamental wavelength radiation has a wavelength of about 980 nanometers.

16. A method of generating optical radiation comprising the steps of:
generating laser radiation having a fundamental wavelength with a gain medium in the form of an optically pumped semiconductor (OPS);
circulating the fundamental wavelength radiation through a first optically nonlinear crystal arranged to divide a portion of the circulating fundamental wavelength radiation into signal wavelength and idler wavelength radiation portions in a parametric division process, the signal wavelength being longer than the fundamental wavelength and shorter than the idler wavelength, the first optically nonlinear crystal having a first bandwidth for the parametric division process; and
circulating the signal wavelength radiation and a remaining portion of the fundamental wavelength radiation through a second optically nonlinear crystal arranged to generate output radiation by sum-frequency mixing the fundamental wavelength and signal wavelength radiations, the second optically nonlinear crystal having a second bandwidth for the sum-frequency mixing process, the second bandwidth being greater than the first bandwidth.

17. The method of claim 16, wherein the fundamental wavelength radiation has a wavelength between about 900 nanometers and about 1100 nanometers and the output radiation is between 550 nm and 700 nm.

18. The method of claim 16, wherein the second optically nonlinear crystal is a crystal of lithium triborate (LBO) and the first optically nonlinear crystal is a crystal of potassium titanyl arsenate (KTA).

19. The method of claim 18, wherein the sum-frequency radiation has a wavelength of about 628 nanometers and the fundamental wavelength radiation has a wavelength of about 1064 nanometers.

20. The method of claim 18, wherein the sum-frequency radiation has a wavelength of about 575 nanometers and the fundamental wavelength radiation has a wavelength of about 980 nanometers.

* * * * *